(12) United States Patent
Chen et al.

(10) Patent No.: US 8,009,069 B2
(45) Date of Patent: Aug. 30, 2011

(54) METHOD AND DEVICE FOR ENCODING A BIT SEQUENCE

(75) Inventors: Qu Qing Chen, Beijing (CN); Zhi Bo Chen, Beijing (CN); Kang Ying Cai, Beijing (CN); Jun Teng, Beijing (CN)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 12/657,246

(22) Filed: Jan. 15, 2010

(65) Prior Publication Data

US 2010/0194610 A1     Aug. 5, 2010

(30) Foreign Application Priority Data

Jan. 30, 2009  (EP) ..................................... 09305086

(51) Int. Cl.
*H03M 7/40*     (2006.01)
(52) U.S. Cl. .......................................... 341/67; 382/245
(58) Field of Classification Search .............. 341/59–90; 382/245, 251, 235; 708/252, 253; 375/241, 375/240.03, E7.144, E7.161
See application file for complete search history.

(56) References Cited

U.S. PATENT DOCUMENTS

| | | | |
|---|---|---|---|
| 5,818,877 A * | 10/1998 | Tsai et al. | 375/241 |
| 7,454,076 B2 * | 11/2008 | Chen et al. | 382/245 |
| 7,483,584 B2 * | 1/2009 | Chen et al. | 382/245 |
| 7,791,507 B2 * | 9/2010 | Coene et al. | 341/59 |

OTHER PUBLICATIONS

Search Report dated May 7, 2009.
Bodden et al., "Arithmetische Kodierung", Internet Article, [Online], URL.: http://www.bodden.de/wordpress/wp-content/uploads/2007/11ac.pdf>, Apr. 2002.
Howard et al., "Practical Implementations of Arithmetic Coding", Internet Article, [Online], URL: http://www.cs.duke.edu/jsv/Papers/HoV92.actech.pdf>, 1992.
Smith, "Cellular Automata Methods in Mathematical Physics", Internet Article, [Online], URL.: http://delivery.acm.org/10.1145/890000/8885418/MIT_Artificial_Intelligence_Laboratory_TR-615.pdf?

* cited by examiner

*Primary Examiner* — Lam T Mai
(74) *Attorney, Agent, or Firm* — Robert D. Shedd; Jeffrey M. Navon

(57) ABSTRACT

The invention is related to a method and a device for encoding of a bit sequence. Said method comprises generating, for each run of Ones comprised in the bit sequence, a unary representation of length of the respective run of Ones, generating a first sequence by concatenating the generated unary representations of lengths of runs of Ones, generating, for each run of Zeroes comprised in the bit sequence, a unary representation of the length of the respective run of Zeroes, generating a second sequence by concatenating the generated unary representations of lengths of runs of Zeroes, and bit plane encoding the generated first and second sequence of unary representations. In most cases, overall entropy of bit planes of unary representations of run lengths is smaller than entropy of the bit sequence. Thus, more compact encoding can be achieved.

8 Claims, 3 Drawing Sheets

METHOD AND DEVICE FOR ENCODING A BIT SEQUENCE

Figure 1:
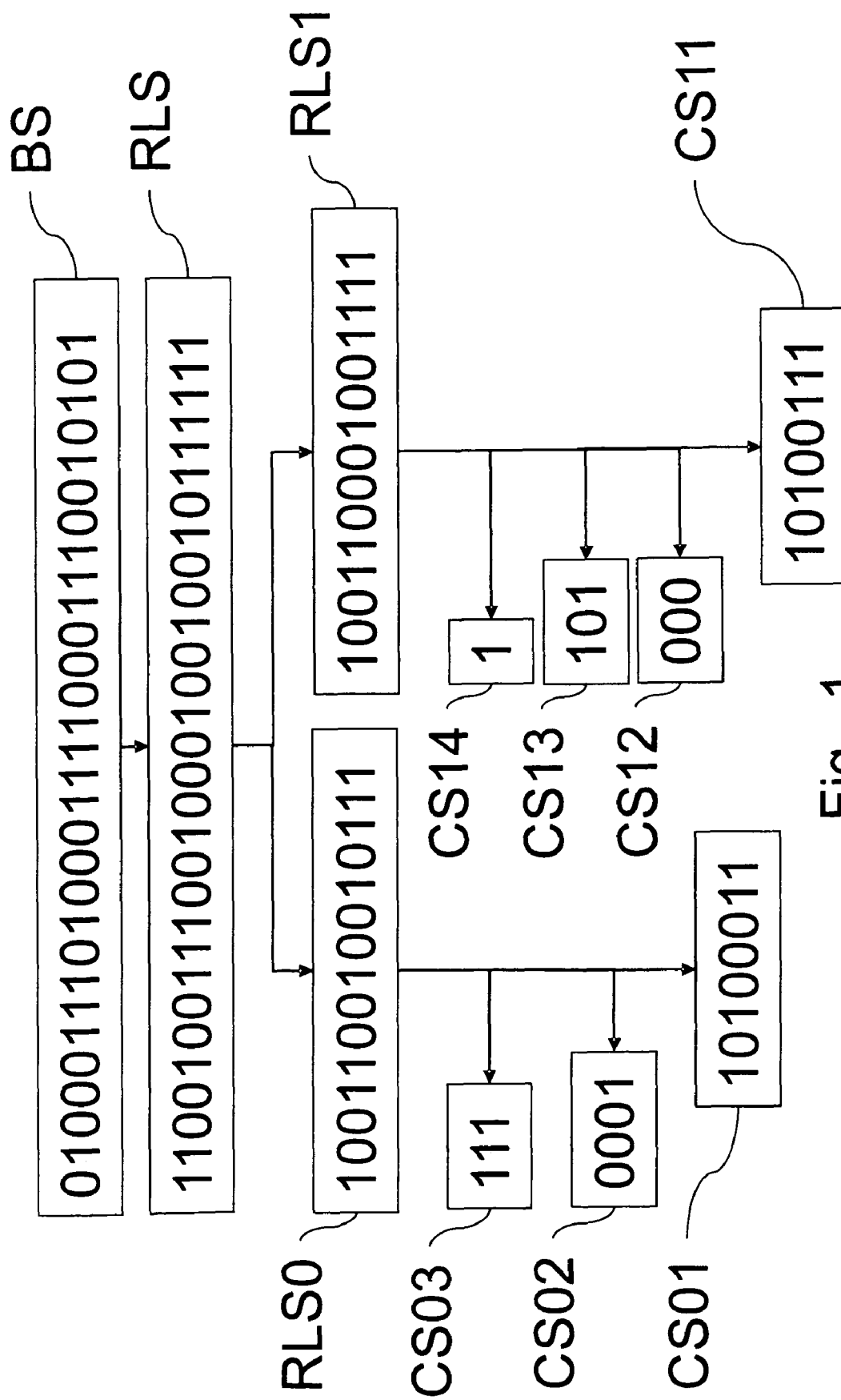

This application claims the benefit, under 35 U.S.C. §119, of European Patent Application No. 09305086.2 of 30 Jan. 2009.

BACKGROUND

The invention is related to a method and a device for encoding a bit sequence.

Bit sequences results, for instance, from encoding digital multimedia content like audio, video, combinations thereof or side information accompanying such content. Encoding such bit sequences for compact representation of at least one of the encoded content and the side information is crucial for efficient use of storage capacities and transmission bandwidth.

Each bit sequence, which is not a trivial bit sequence consisting either only of Zeroes or only of Ones, may also be understood as consisting of one or more runs of Zeroes alternating with one or more runs of Ones wherein each run is a contiguous sub-sequence of one or more equally valued bits which is immediately followed and immediately preceded by another run of bits each having a different bit value as long as the run is neither the very first nor the very last run of the bit sequence.

In bit sequences, bits of a first possible bit value and bits of a different second possible bit value commonly occur with significantly different frequencies, e.g. Zeroes are more likely than Ones or vice versa. Then, entropy of the bit sequence is smaller than the number of bits comprised in the bit sequence.

If so, there is redundancy in the bit sequence which can be removed by lossless compression.

It is known to use an entropy coding method for lossless compression of bit sequences. Basically, there are three kinds of entropy coding method: (1) variable length coding (VLC), like Huffman coding, (2) arithmetic coding, and (3) dictionary-based compression, like Lempel-Ziv compression or Lempel-Ziv-Welch compression.

The effect of entropy coding is that, difference between entropy of the compressed bit sequence and number of bits comprised in the compressed bit sequence is smaller than difference between entropy of and number of bits comprised in the bit sequence prior to compression.

There is ongoing effort in the art for an alternative approaches in principle adapted for improving encoding.

INVENTION

In order to achieve such improvement, the invention proposes a method for encoding a sequence of bits according to claim 1 and a corresponding device according to claim 7.

Said method for encoding a sequence of bits comprises generating, for each run of Ones comprised in the bit sequence, a unary representations of the length of the respective run of Ones, generating a first sequence (RLS1) by concatenating the generated unary representations of lengths of runs of Ones, generating, for each run of Zeroes comprised in the bit sequence, a second sequence of unary representations of the length of the respective run of Zeroes, generating a second sequence (RLS0) by concatenating the generated unary representations of lengths of runs of Zeroes, and bit plane encoding the generated first and second sequence.

In most cases, overall entropy of bit planes of unary representations of run lengths is smaller than entropy of the bit sequence. Thus, more compact encoding can be achieved. For sure, overall entropy of the bit planes will not exceed entropy of the bit sequence.

In an embodiment bit planes of said first sequence and bit planes of said second sequence are encoded separately.

In another embodiment bit plane encoding comprises generating a third sequence of unary representations of lengths of runs of Ones in a bit plane generating fourth sequence of unary representations of lengths of runs of Zeroes in said bit plane, and bit plane encoding the generated third and fourth sequence of unary representations.

In yet another embodiment, the method further or solely comprises the steps of (a) receiving a current bit of said sequence of bits, (b) receiving a next bit of said sequence of bits, (c) outputting a bit having a value different from the current bit's value if the next bit is of a preferred possible bit value and outputting a bit having the current bit's value, otherwise, (d) repeating steps (b) and (c) until the end of the bit sequence is reached wherein said next bit is used as current bit and (e) encoding the outputted bits.

In said yet another embodiment of the method, the bit may be outputted to an adjuvant sequence if the current bit is of said preferred possible bit value and the bit may be outputted to a further adjuvant sequence, otherwise.

The adjuvant sequence and the further adjuvant sequence, each, may comprise sub-sequences corresponding to different possible positions of a bit in runs. Then, the yet another embodiment of the method may further comprise outputting the bit to that one of the sub-sequences which corresponds to the current bit and the current bit's position in a current run.

The invention further proposes a method for decoding a sequence of bits from encoded first and second bit planes according to claim 5 and a corresponding device according to claim 8.

Said method for forming a sequence of bits comprises the steps of decoding the first bit planes resulting in a first sequence of unary representations, decoding the second bit planes resulting in a second sequence of unary representations, using the first sequence for generating runs of Ones wherein, for each unary representation comprised in the first sequence, a run of Ones of corresponding length is generated, using the second sequence for generating runs of Zeroes wherein, for each unary representation comprised in the second sequence, a run of Zeroes of corresponding length is generated, and forming the sequence of bits by alternating the generated runs of Zeroes and the generated runs of Ones.

In an embodiment, said decoding method comprises the steps of (a) using a preferred possible bit value as current value, (b) receiving a current bit of said sequence of bits, (c) outputting a bit of said current value, (d) changing the current value if the current bit is of said preferred possible bit value and (e) repeating steps (b)-(d).

DRAWINGS

Exemplary embodiments of the invention are illustrated in the drawings and are explained in more detail in the following description.

Figure 2:
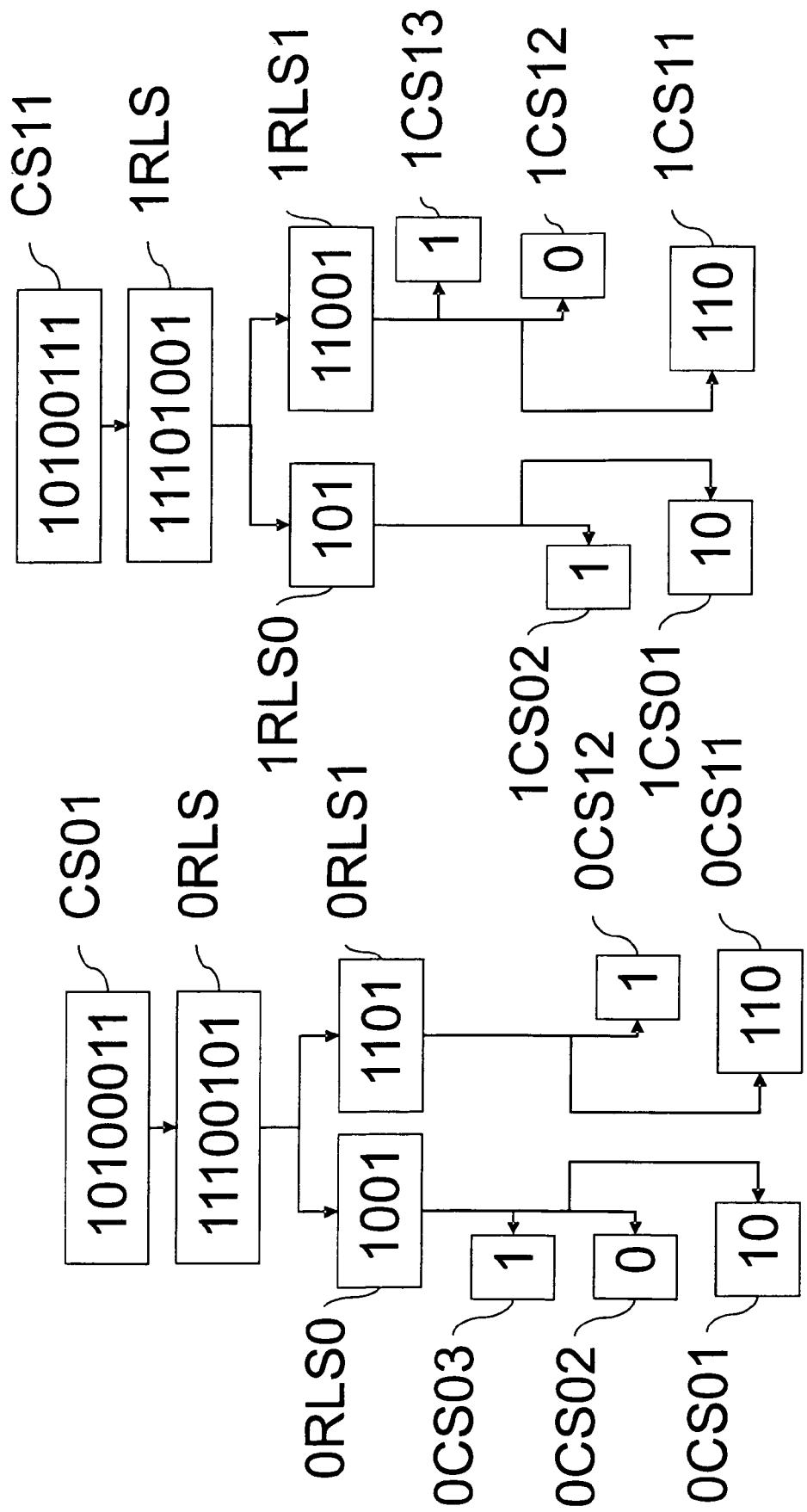
Figure 3:
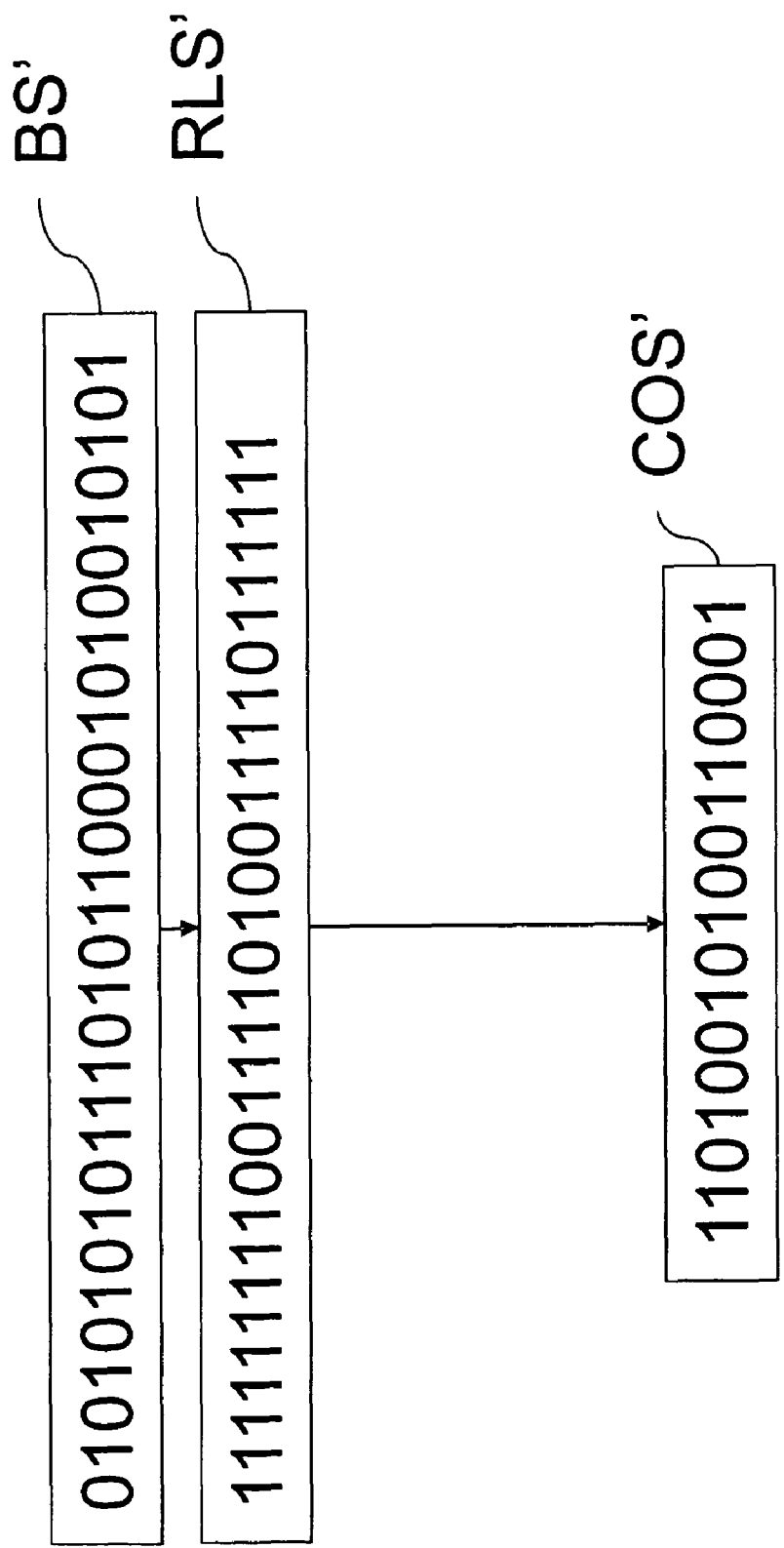

In the figures:

FIG. 1 depicts a first example input sequence, an exemplary run length sequence, further exemplary run length sequences and a first and a second set of exemplary bit planes generated in course of application of an exemplary embodiment of the inventive method, FIG. 2 depicts yet further exemplary run length sequences and yet further exemplary bit plane sequences generated in course of iterative application of the exemplary embodiment of the inventive method and FIG. 3 depicts a second example input sequence as well as another exemplary run length sequences generated in course of application of an exemplary embodiment of the inventive method.

EXEMPLARY EMBODIMENTS

In FIG. 1, a first exemplary input bit sequence BS of 30 bits length is depicted. In the example of FIG. 1, Zeroes and Ones occur equally frequent in BS, i.e. there are 15 Zeroes and 15 Ones in BS. The entropy of the first exemplary input bit sequence BS can be calculated as $$H(B) = -15 * \log_2(15/30) - 15 * \log_2(15/30) = 30$$

So it appears as if 30 bits are required for representing BS.

But, from the first exemplary input bit sequence BS an exemplary run length sequence RLS can be formed wherein BS can be reconstructed from RLS.

RLS is exemplarily formed from outputted bits of the following method: (a) receiving a current bit of said input bit sequence BS, (b) receiving a next bit of said input bit sequence BS, (c) outputting a bit having a value different from the current bit's value if the next bit is of a preferred possible bit value, which is One in the example, and outputting a bit having the current bit's value, otherwise, (d) repeating steps (b) and (c) until the end of the bit sequence is reached wherein said next bit is used as current bit.

In RLS, there is a One for each Zero of BS which immediately precedes a One. Further, for each One of BS which immediately precedes a One there is Zero in RLS.

Since BS comprises 8 Zeroes immediately preceding a One and only 7 Ones immediately preceding a One, Zeroes and Ones appear with different frequencies in BS and in RLS.

That is, in RLS there are only 14 Zeroes but 16 Ones. Thus, entropy of RLS is:

$$H(RLS) = -14 * \log_2(14/30) - 16 * \log_2(16/30) = 29.90376$$

Thus, for representing RLS still 30 bits are required.

Two further exemplary run length sequences may be formed from RLS if in step (c) the bit is outputted to a first further run length sequence if the current bit is of said preferred possible bit value and the bit is outputted to a second further run length sequence, otherwise.

The first further run length sequence RLS0 comprises those bits of RLS for which the corresponding bit of BS is Zero. And a second further run length sequence RLS1 comprises those bits of RLS for which the corresponding bit of BS is One.

From RLS0 a first set of three exemplary bit planes CS01, CS02 and CS03 is generated.

CS01 contains those bits of RLS0 which are not immediately preceded by a Zero-valued bit.

CS02 contains those bits of RLS0 which are immediately preceded by a Zero-valued bit in RLS0 which is sorted into CS01. Thus, the number of bits contained in CS02 equals the number of Zeros comprised in CS01.

Finally, CS03 contains those bits of RLS0 which are immediately preceded by a Zero-valued bit in RLS0 which is sorted into CS02. As for CS02, number of bits contained in CS03 equals the number of Zeros comprised in CS02.

As CS03 does not contain any Zeros there is no CS04.

CS01, CS02 and CS03 may be sub-sequences of an additional adjuvant bit sequence consisting of a concatenation of CS01, CS02 and CS03. The overall entropy of the first set is:

$$H(CS01) + H(CS02) + H(CS03) = 11.2451$$

In the same way, a second set of four exemplary bit planes CS11, CS12, CS13 and CS14 is generated from RLS1.

The overall entropy of the second set is:

$$H(CS11) + H(CS12) + H(CS13) + H(CS14) = 10.39036$$

Thus, overall entropy of the first set and the second set is far smaller than entropy of BS although BS is still reconstructible from the first and the second set.

The principle may be applied in iteration. That is, at least one of CS01 and CS11 may be taken as input sequences. This is exemplarily depicted in FIG. 2. From CS01 and CS11, sequences 0RLS and 1RLS are formed. The bits of 0RLS and 1RLS are separated in two pairs of sequences, namely 0RLS0, 0RLS1, 1RLS0 and 1RLS1. The bits of 0RLS0, 0RLS1, 1RLS0 and 1RLS1 are sorted into different contexts.

Bits of 0RLS0 are sorted into the contexts 0CS01, 0CS02 and 0CS03 while bits of 0RLS1 are sorted into the contexts 0CS11 and 0CS12.

And, bits of 1RLS0 are sorted into the contexts 1CS01 and 1CS02 while bits of 1RLS1 are sorted into the contexts 1CS11, 1CS12 and 1CS13.

Thus, CS01 is replaced by 0CS01, 0CS02, 0CS03, 0CS11 and 0CS12. And CS11 is replaced by 1CS01, 1CS02, 1CS11, 1CS12 and 1CS13.

So, BS is represented by CS02, CS03, CS12, CS13, CS14, 0CS01, 0CS02, 0CS03, 0CS11, 0CS12, 1CS01, 1CS02, 1CS11, 1CS12 and 1CS13. The overall entropy of the representation of BS by help of these bit plane sequences is 15.509775 and thus almost half the entropy of BS as is.

Entropy reduction can be exploited at least to some degree for instance by using context based entropy coding or bit plane encoding for further compressing these bit plane sequences. For instance context based arithmetic coding, context based Huffman-coding or dictionary-based compression may be used.

Although entropy is just a rough estimate of coding performance, arithmetic coding, for instance, can almost achieve entropy especially when input data size is large enough, e.g., 1024 bits.

The invention exploits that in most sequences the number of consecutive Zeros or consecutive Ones is highly correlated.

The proposed method can be utilized together with any traditional entropy coding method. Some flag bit(s) can be inserted into the bit stream to indicate whether the entropy coding method was applied to the bit sequence, directly, or whether the entropy coding method was used in course of the proposed method.

In FIG. 3, a second exemplary input bit sequence BS' of 30 bits length is depicted. Again, Zeroes and Ones occur equally frequent in BS', i.e. there are 15 Zeroes and 15 Ones in BS. Thus entropy of the second exemplary input bit sequence BS' is 30 and BS' appears as if could not further be compressed.

But, if another run length sequence RS' is formed from the second exemplary input bit sequence BS' in the same way as the run length sequence RLS is formed from BS a significant entropy reduction can be achieved already by forming RLS'.

That is, RLS' comprises only 6 Zeroes but 24 Ones and has entropy of 21.65784.

By help of a dictionary mapping sequences of 1111 onto 1, sequences of 1001 onto 01, sequences of 1110 onto 001 and sequences of 11 onto 0001 (as stop sequence for representing the last two bits), RLS' can be transformed into compressed output sequence COS' consisting of only 17 bits with 8 Ones and 9 Zeroes with entropy of about 16.96.

The input bit sequence BS may be a comprised in a longer bit sequence to-be-compressed or it may be the whole bit sequence to-be-compressed.

For long bit sequences to-be-compressed, there is an embodiment of the invention proposed which allows for transforming the bit sequence into a run length sequence bit by bit. That is, connected to a first encoder which sequentially generates the bits of the bit sequence, there may be a transformation device which receives these generated bits and outputs, for each received bit, an output bit. Thus transformation of the bit sequence into the run length sequence can be done on-the-fly with only one bit latency.

Said transformation device comprises means for receiving bits of a sequence BS, BS', means for outputting bits to a second encoder which encodes the outputted bits. The means for outputting bits are adapted such that the value of an outputted bit dependents on the values of a previously received bit and a currently received bit wherein the previously received bit immediately precedes the currently received bit in the bit sequence BS, BS'. That is, the outputted bit has a value different from the value of the previously received bit if the currently received bit is of a preferred possible bit value and, otherwise, has the value of the previously received bit. The device is adapted for using the currently received bit as previously received bit after outputting a bit and for repeating reception of bits and outputting of bits until the end of the bit sequence BS is reached. Thus, for each previously received bit there is a corresponding outputted bit. For the last bit of the bit sequence, said last bit having no subsequent bit thus never being a previously received bit, a bit of said preferred possible bit value is outputted by the device.

The device may comprise a counter whose value is initialized to One, wherein the counter value is increased by One if the value of the previously received bit equals that of the currently received bit and is reset to One if the value of the previously received bit differs from that of the currently received bit.

Then, the second encoder may be adapted for context-based arithmetic encoding of the outputted bits wherein the context of an outputted bit is defined by at least one of the value of the corresponding previously received bit and the counter value.

The invention claimed is:

1. Method for encoding a bit sequence, wherein said method comprises using a processor for executing the steps of
   generating, for each run of Ones comprised in the bit sequence, a unary representation of the length of the respective run of Ones,
   generating a first sequence by concatenating the generated unary representations of lengths of runs of Ones,
   generating, for each run of Zeroes comprised in the bit sequence, a unary representation of length of the respective run of Zeroes,
   generating a second sequence by concatenating the generated unary representations of lengths of runs of Zeroes and
   bit plane encoding the generated first and second sequence.

2. Method of claim 1, wherein
   bit planes of said first sequence and bit planes of said second sequence are encoded separately.

3. The method of claim 1, wherein bit plane encoding comprises:
   generating with the processor a third sequence of unary representations of lengths of runs of Ones in a bit plane
   generating with the processor a fourth sequence of unary representations of lengths of runs of Zeroes in said bit plane, and
   bit plane encoding with the processor the generated third and fourth sequence of unary representations.

4. Method according to claim 1, wherein said method comprises the steps of
   (a) using the processor for receiving a current bit of said sequence of bits,
   (b) using the processor for receiving a next bit of said sequence of bits,
   (c) using the processor for outputting, to a buffer, a bit having a value different from the current bit's value if the next bit is of a preferred possible bit value and outputting a bit having the current bit's value, otherwise,
   (d) repeating steps (b) and (c) until the end of the bit sequence (BS) is reached wherein said next bit is used as current bit and
   (e) using the processor for compressing the outputted bits.

5. Method for forming a sequence of bits from first and second encoded bit planes, wherein said method comprises using a processor for executing the steps of
   decoding the first bit planes resulting in a first sequence of unary representations,
   decoding the second bit planes resulting in a second sequence of unary representations,
   using the first sequence for generating runs of Ones wherein, for each unary representation comprised in the first sequence, a run of Ones of corresponding length is generated,
   using the second sequence for generating runs of Zeroes wherein, for each unary representation comprised in the second sequence, a run of Zeroes of corresponding length is generated, and
   forming the sequence of bits by alternating the generated runs of Zeroes and the generated runs of Ones.

6. Method according to claim 5, wherein said method comprises the steps of
   (a) using the processor for determining a preferred possible bit value as current value,
   (b) using the processor for receiving a current bit of said sequence of bits,
   (c) outputting, to a buffer, a bit of said current value,
   (d) using the processor for changing the current value if the current bit is of said preferred possible bit value and
   (e) repeating steps (b)-(d).

7. Device for encoding a bit sequence, said device comprises
   generating means for generating, for each run of Ones comprised in the bit sequence, a unary representations of the length of the respective run of Ones,
   said generating means being adapted for generating, for each run of Zeroes comprised in the bit sequence, a unary representation of the length of the respective run of Zeroes,
   concatenating means for generating a first sequence by concatenating the generated unary representations of lengths of runs of Ones,
   said concatenating means being adapted for generating a second sequence by concatenating the generated unary representations of lengths of runs of Zeroes and
   means for bit plane encoding the generated first and second sequence of unary representations.

8. Device for decoding a sequence of bits from first and second encoded bit planes, said device comprises
   decoding means for decoding the first bit planes resulting in a first sequence of unary representations,
   said decoding means being adapted for decoding the second bit planes resulting in a second sequence of unary representations generating means for using the first sequence for generating runs of Ones wherein, for each unary representation comprised in the first sequence, a run of Ones of corresponding length is generated, said generating means being adapted for using the second sequence for generating runs of Zeroes wherein, for each unary representation comprised in the second sequence, a run of Zeroes of corresponding length is generated, and means for forming the sequence of bits by alternating the generated runs of Zeroes and the generated runs of Ones.

* * * * *